US012249638B2

(12) United States Patent
Rezeq

(10) Patent No.: US 12,249,638 B2
(45) Date of Patent: Mar. 11, 2025

(54) NON-VOLATILE MEMORY SYSTEMS BASED ON SINGLE NANOPARTICLES FOR COMPACT AND HIGH DATA STORAGE ELECTRONIC DEVICES

(71) Applicant: Khalifa University of Science and Technology, Abu Dhabi (AE)

(72) Inventor: Moh'd Rezeq, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 780 days.

(21) Appl. No.: 17/292,552

(22) PCT Filed: Nov. 13, 2019

(86) PCT No.: PCT/IB2019/059736
§ 371 (c)(1),
(2) Date: May 10, 2021

(87) PCT Pub. No.: WO2020/100051
PCT Pub. Date: May 22, 2020

(65) Prior Publication Data
US 2022/0005932 A1    Jan. 6, 2022

Related U.S. Application Data

(60) Provisional application No. 62/760,412, filed on Nov. 13, 2018.

(51) Int. Cl.
*H01L 29/423* (2006.01)
*B82Y 10/00* (2011.01)
(Continued)

(52) U.S. Cl.
CPC ........ *H01L 29/42396* (2013.01); *B82Y 10/00* (2013.01); *H01L 29/7839* (2013.01); *H10B 43/00* (2023.02); *H01L 29/66825* (2013.01)

(58) Field of Classification Search
CPC ......... B82Y 10/00; B82Y 40/00; B82Y 30/00; H01L 29/7839; H01L 29/40114; H10B 43/00
See application file for complete search history.

(56) References Cited

U.S. PATENT DOCUMENTS 9,016,108 B1    4/2015  Miranda et al.
9,753,001 B1    9/2017  Miranda et al.
(Continued)

FOREIGN PATENT DOCUMENTS

CN    101312213 A    11/2008
EP    1536483 A1    6/2005
KR    0150789 B1 *  12/1998

*Primary Examiner* — Victor A Mandala
*Assistant Examiner* — Lawrence C Tynes, Jr.
(74) *Attorney, Agent, or Firm* — Hayes Soloway PC

(57) ABSTRACT

There is provided a structure of a nano memory system. The disclosed unit nano memory cell comprises a single isolated nanoparticle placed on the surface of a semiconductor substrate (301) and an adjacent nano-Schottky contact (303). The nanoparticle works as a storage site where the nano-Schottky contact (303) works as a source or a drain of electrons, in or out of the semiconductor substrate (301), at a relatively small voltage. The electric current through the nano-Schottky contact (303) can be turned on (reading 1) or off (reading 0) by charging or discharging the nanoparticle. Since the electric contact is made by a nano-Scottky contact (303) on the surface and the back contact of the substrate (301), and the charge is stored in a very small nanoparticle, this allows to attain the ultimate device down-scaling. This would also significantly increase the number of nano memory cells on a chip. Moreover, the charging and discharging (writing/erasing), as well as the reading voltages are lower than those needed for CMOS based flash memory cells, due to the small nano-Schottky contact (301) and the small size of the nanoparticle for charge storage.

20 Claims, 13 Drawing Sheets

(51) Int. Cl.
*H01L 29/78* (2006.01)
*H10B 43/00* (2023.01)
*H01L 29/66* (2006.01)

(56) References Cited

U.S. PATENT DOCUMENTS

| | | | |
|---|---|---|---|
| 2007/0126051 A1* | 6/2007 | Kanegae | H01L 29/42332 |
| | | | 257/E29.302 |
| 2007/0257297 A1 | 11/2007 | Seol et al. | |
| 2008/0175032 A1* | 7/2008 | Tanaka | G11C 13/0028 |
| | | | 257/E27.071 |
| 2010/0008128 A1 | 1/2010 | Yoshii et al. | |
| 2013/0015517 A1* | 1/2013 | Widjaja | H01L 29/42328 |
| | | | 257/316 |
| 2014/0151778 A1 | 6/2014 | Purayath et al. | |
| 2014/0252447 A1* | 9/2014 | Lee | H01L 29/66825 |
| | | | 257/316 |
| 2015/0179808 A1* | 6/2015 | Kim | H01L 29/7881 |
| | | | 438/594 |
| 2015/0236029 A1* | 8/2015 | Afzali-Ardakani | ............ |
| | | | H01L 29/4966 |
| | | | 977/840 |
| 2015/0318369 A1* | 11/2015 | Kraus | H01L 29/40114 |
| | | | 438/593 |

* cited by examiner

NON-VOLATILE MEMORY SYSTEMS BASED ON SINGLE NANOPARTICLES FOR COMPACT AND HIGH DATA STORAGE ELECTRONIC DEVICES

CROSS-REFERENCE TO RELATED APPLICATIONS AND PRIORITY

This patent application claims priority from PCT Patent Application No. IB2019/059736 filed Nov. 13, 2019, which claims priority from U.S. Provisional Patent Application No. 62/760,412 filed Nov. 13, 2018. Each of these patent applications are herein incorporated by reference in its/their entirety.

FIELD OF THE INVENTION

The present invention relates to the field of implementing large non—volatile memory storage for electronic devices, and more particularly to a system and method for increasing capacity of data storage in electronic systems.

BACKGROUND OF THE INVENTION

The rapid development in the technology of electronic devices with large memory storage capability like mobile phones, computers, laptops, digital cameras etc, is primarily attributed to the development of nonvolatile flash memory devices and to device down-scaling. However, there is still a growing interest in increasing the capacity of the data storage in most of these electronic systems. This actually requires the continuous need of scaling down the basic unit memory cell in such devices. In addition, device scaling is a requirement for low power consumption. In fact, the current flash memory devices are made of CMOS based floating gate MOSFET transistors as basic unit cells. Therefore, scaling down these basic unit cells is limited by similar problems inherent in CMOS devices. Like gate length, the leakage current through the oxide layer, short channel effect, controlling the dopant of the source and drain terminals in a very small area.

Furthermore, there are some limitations linked to the structure of these unit memory cells like the parasitic capacitance effect between the floating gate and the drain, charge losses through the defects in the oxide layers. Increasing the thickness of the oxide layer between the floating gate and the substrate in order to increase the charge retention capability will in turn result in a slower write/erase speed, and relatively high read and write voltages.

A Schottky barrier refers to a metal-semiconductor contact having a large barrier height and low doping concentration that is less than the density of states in the conduction band or valence band. The potential barrier between the metal and the semiconductor can be identified on an energy band diagram, for which an energy band diagram of the metal and the semiconductor is considered initially, and are aligned using a same vacuum level. As the metal and semiconductor are brought together, the Fermi energies of the two materials must be equal at thermal equilibrium. Fermi level is the term used to describe the top of a collection of electron energy levels at absolute zero temperature.

To reduce the thickness of the oxide layers in order to increase the programming speed and reduce the programming voltage while maintaining the retention time, some researchers proposed using nanocrystals embedded in the dielectric gate layers instead of the conventional floating gate. Although this approach would help to reduce the dielectric and oxide layered around the charge storage zone, there are still other limitation issues from the structure of the source/drain and the control gate sides. In addition, the electric charge is stored in a group of nanocrystals, which means larger area, and also the charging or discharging process is not guaranteed to take place in all nanocrystals simultaneously.

Accordingly, there exists a need to provide a memory system with increased data storage capacity, low power consumption and ultimate device down-scaling.

SUMMARY OF THE INVENTION

Therefore it is an object of the present invention to provide a nano memory system which allows to attain ultimate device down-scaling and increased charge retention capability.

The present invention involves a unit nano memory cell comprising a single isolated nanoparticle positioned on a surface of a semiconductor substrate wherein the single isolated nanoparticle works as a charge storage site.

In an embodiment of the present invention, the unit nano memory cell further comprises a single nano metal-semiconductor contact (NMSC) working as a source or a drain of electrons at a relatively small voltage.

In another embodiment of the present invention, the single nanoparticle is isolated from the semiconductor substrate and the nano metal-semiconductor contact (NMSC) by 1 to 5 nanometres of a dielectric material.

In another embodiment of the present invention, the dielectric material comprises at least a portion having a high dielectric constant (k), such as $Si_3N_4$, $ZrO_2$, $HfO_2$ or $Y_2O_3$.

In another embodiment of the present invention, the single isolated nanoparticle is made of metal or another semiconductor material and has a radius in a range of 2-20 nanometres.

In another embodiment of the present invention, the semiconductor substrate surface has a top side and a bottom side, and wherein the single nano metal-semiconductor contact (NMSC) and the single isolated nanoparticle are positioned on the top side of the semiconductor substrate surface and an electric contact is made with the top side and bottom side of the semiconductor substrate.

In another embodiment of the present invention, the electric contact is a nano-Schottky contact.

Another aspect of the present invention includes a method of charging a unit nano memory cell comprising a semiconductor substrate and a single isolated nanoparticle positioned on a surface of the semiconductor substrate, the method comprising the steps of charging the single isolated nanoparticle with a negative charge and grounding the semiconductor substrate.

In an embodiment of the present invention, the charging the single isolated nanoparticle is conducted using a nano metal electrode placed on top of the single isolated nanoparticle, wherein the nano metal electrode is a charge control electrode (CCE).

In another embodiment of the present invention, the charging the single isolated nanoparticle allows electric current to pass through a nano-Schottky junction.

In another embodiment of the present invention, a method of discharging the unit nano memory cell comprises reversing a bias used for charging the unit nano memory cell, which results in erasing of data stored in the unit nano memory cell.

In another embodiment of the present invention, a method of negatively charging the unit nano memory cell comprises the step of applying a negative voltage between the single nano metal-semiconductor contact (NMSC) and the charge control electrode (CCE).

In another embodiment of the present invention, a method of positively charging the unit nano memory cell comprises the step of reversing a polarity of the applied negative voltage between the single nano metal-semiconductor contact (NMSC) and the charge control electrode (CCE).

In another embodiment of the present invention, the single isolated nanoparticle and the single nano metal-semiconductor contact (NMSC) are placed on the semiconductor surface and a charge control electrode (CCE) is placed on the top of the single isolated nanoparticle.

In another embodiment of the present invention, source and drain terminals of the single nano metal-semiconductor contact (NMSC) comprise of nano-Schottky contacts.

In another embodiment of the present invention, charging and discharging (writing/erasing) processes of the single isolated nanoparticle are analogous to writing and erasing processes respectively.

In another embodiment of the present invention, charging and discharging (writing/erasing) processes of the single isolated nanoparticle comprise steps of applying a bias between the charge control electrode (CCE) and a back contact of the semiconductor substrate.

In another embodiment of the present invention, charge being stored in a nanoparticle allows device downscaling, and wherein a same voltage source is utilized for each unit nano memory cell for reading, writing and erasing processes.

As another aspect of the present invention, a multiple cell arrangement comprises a plurality of unit nano memory cells, wherein each unit nano memory cell comprises a single isolated nanoparticle and a single charge control electrode (CCE) is utilized for each nanoparticle.

In another embodiment of the present invention, the plurality of nano memory cells is implemented through a series or parallel configuration of the plurality of nano memory cells.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which—

DETAILED DESCRIPTION OF THE INVENTION

The aspects of the method or system to provide a nano memory system which allows to attain ultimate device down-scaling and increased charge retention capability according to the present invention, will be described in conjunction with FIGS. 1-13. In the Detailed Description, reference is made to the accompanying figures, which form a part hereof, and in which is shown by way of illustration specific embodiments in which the invention may be practiced. It is to be understood that other embodiments may be utilized and logical changes may be made without departing from the scope of the present invention. The following detailed description, therefore, is not to be taken in a limiting sense, and the scope of the present invention is defined by the appended claims.

The proposed solution aims at providing or introducing a new structure of nano memory systems. The basic structure of the unit nano memory cell comprises a single isolated nanoparticle placed on the surface of a semiconductor substrate and an adjacent nano-schottky contact. The nanoparticle works as a storage site where the nano-Schottky contact works as a source or a drain of electrons, in or out of the semiconductor, at a relatively small voltage. The electric current through the nano-Schottky junction can be turned on (reading 1) or off (reading 0) by charging or discharging the nanoparticle. Since the electric contact is made by a nano-Scottky contact on the surface and the back contact of the substrate, and the charge is stored in a very small nanoparticle, this allows to attain the ultimate device down-scaling. This would also significantly increase the number of nano-memory cells on a chip. Moreover, the charging and discharging (writing/erasing), as well as the reading voltages are small than those needed for CMOS based flash memory cells, due to the small nano-Schottky contact and the small size of the nanoparticle for charge storage.

Figure 1:
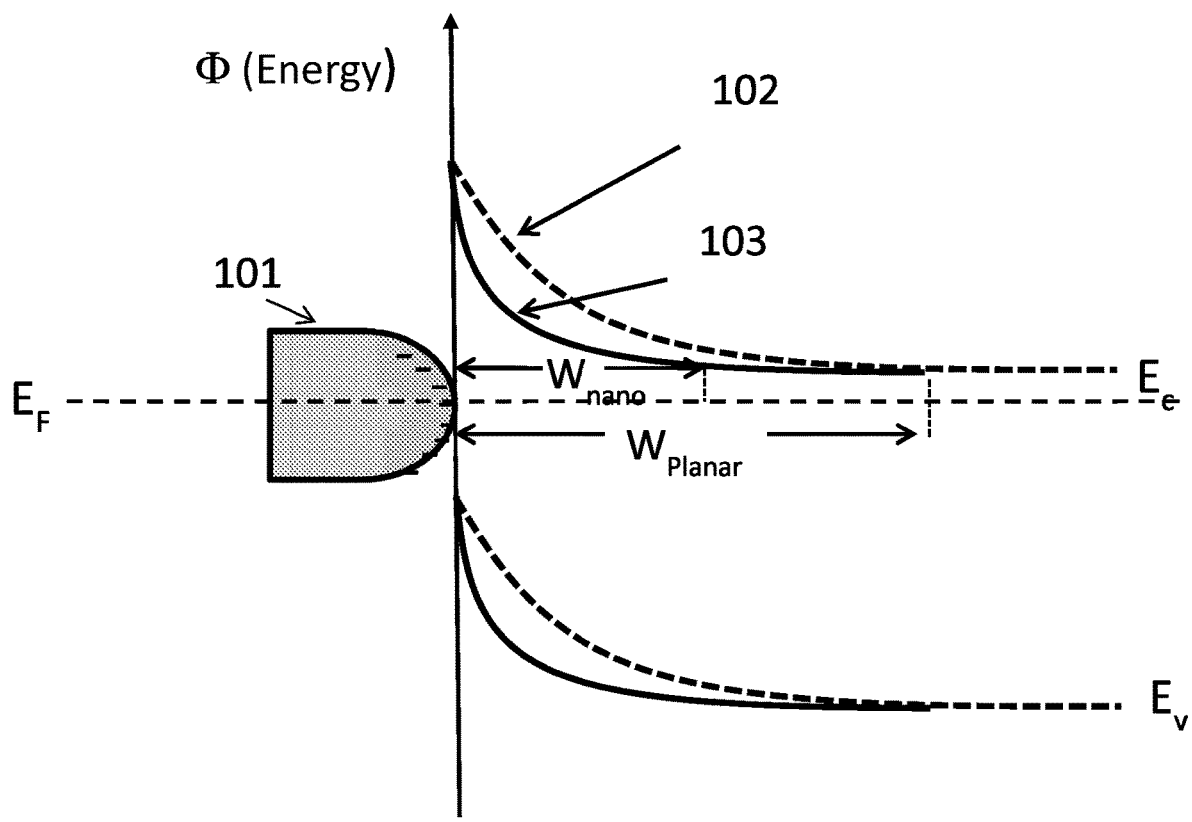
FIG. 1 shows the energy band diagram as the metal contact is reduced from the normal to nano scale.
Figure 2A:
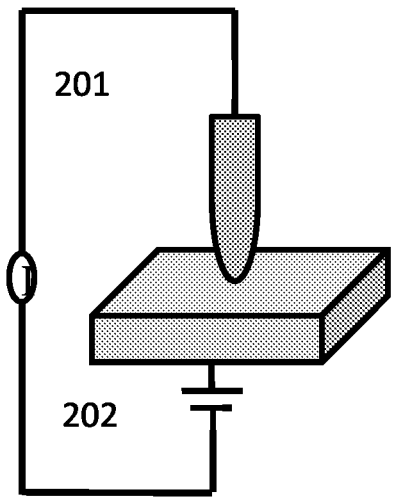
FIG. 2(a) is the schematic of a nano-Schottky junction between a metal nano-probe with a radius less than 10 nm and n-dope semiconductor substrates.
Figure 2B:
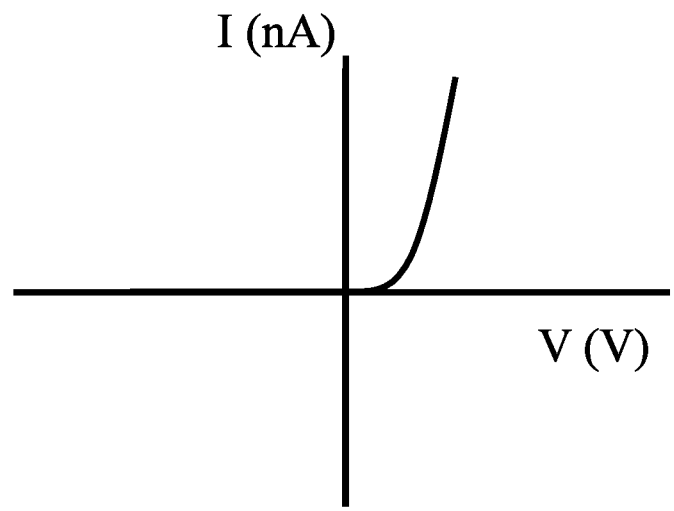
FIG. 2(b) is the current voltage (I-V) typical characteristics of a low dope substrate (1-5 Ohm·cm) which shows a reversed behavior to the enhanced tunneling current.
Figure 2C:
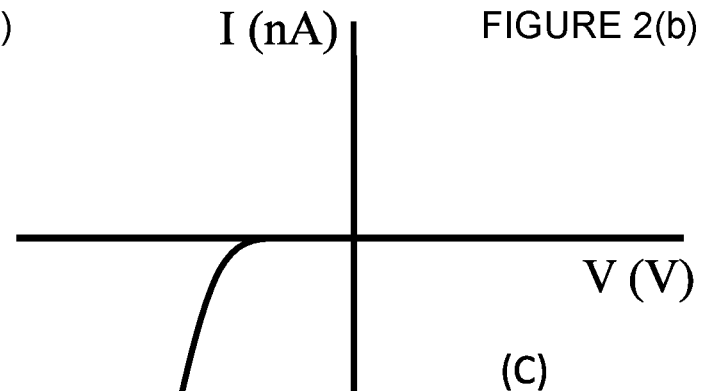
FIG. 2(c) is the current voltage (I-V) typical characteristics of a high dope substrate (0.01-0.1 Ohm·cm), which shows a normal behavior.
Figure 2D:
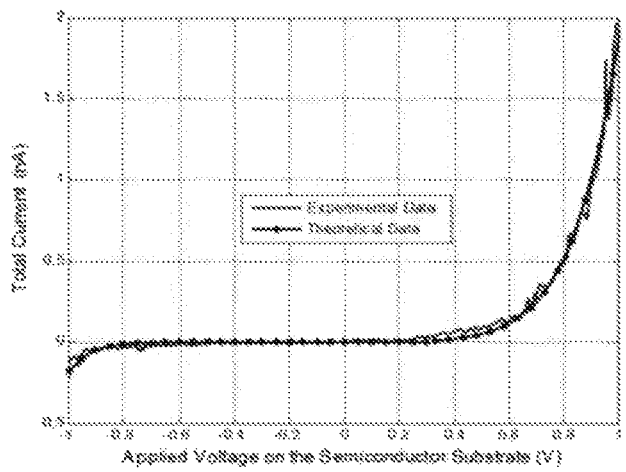
FIG. 2(d) denotes the experimental and simulation data of nano-Schottky contact (nanotip radius10 nm) with low n-dope Silicon substrate; the results show an enhanced tunneling current in the reverse bias.
Figure 3:
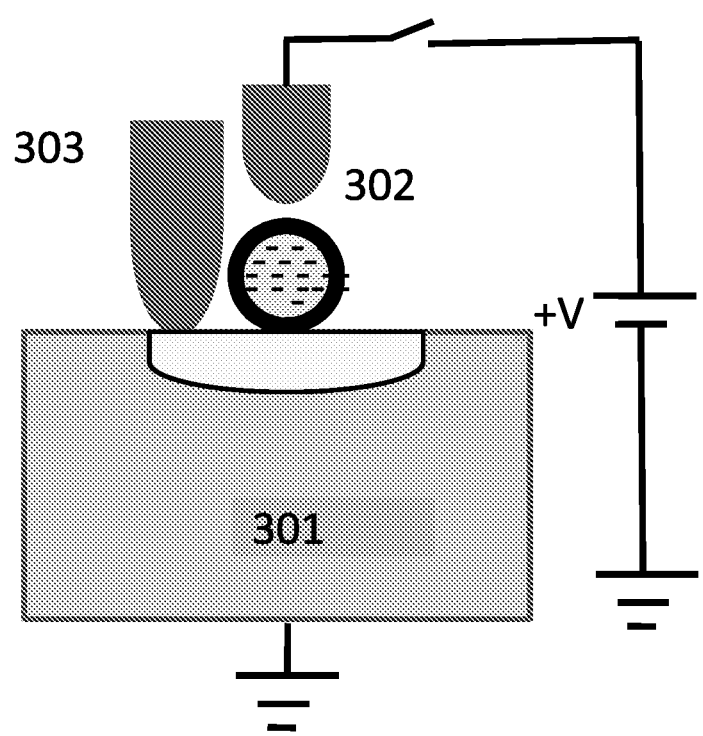
FIG. 3 shows a nano unit memory cell in the negative NP mode, displaying the NMSC, the nanoparticle and CCE.

Recent investigations on nano-Schottky contacts between metal nano-probes and n-dope Si substrates have showed a significant effect of the contact size on the current-voltage (I-V) characteristics of the metal semiconductor (M-S) junction. Due to the very limited contact area where the transferred charge from the semiconductor into the metal is confined to a very small metal surface area which results in an enhancement of the electric field at the nano M-S interface and a narrow barrier, as schematically illustrated in FIG. 1. Numeral 101 denotes metal nano-contact. Numeral 102 denotes band bending due to the planar interface. Numeral 103 denotes band bending due to the nano interface. This in turn results in an enhancement of the tunneling current at a relatively small reverse bias (negative bias on the metal side). Consequently the nano-M-S contacts exhibit a reversed diode rectification behavior compared to conventional M-S contacts, as illustrated in FIG. 2, and observed experimentally traditionally. This reversed (I-V) behavior is prominent when the Si substrate is low n-dope (1-5 Ω·cm) and the radius of the metal contact is less than 20 nm. In FIG. 2(a), numeral 201 denotes metal nano-probe. Numeral 202 denotes n-dope Si substrates.

The above mentioned phenomenon has been previously utilized in developing a new structure of nano tunneling field effect transistors based on single metal nanoparticles embedded on the surface of a semiconductor substrate. One metal nanoparticle is considered as a source of charge (electrons) and negatively biased and the other one is connected to a positive bias and performs as a drain where the tunneling current can be regulated by adjusting the Fermi level in the bulk from the back contact. In this type of nano devices the transistor operates in the reverse bias, unlike the conventional semiconductor devices.

In this new structure of nano memory cells and in accordance with the present invention, a single isolated nanoparticle is utilized as a charge storage site and a single nano metal-semiconductor (M-S) contact as a source or drain. The nanoparticle is isolated from the semiconductor substrate and the nano metal-semiconductor contact (NMSC) by a few nanometer (1-5 nm) of a dielectric material like oxide or nitride or a combination of both or other insulating materials, as well as high k dielectric materials like, $Si_3N_4$, $ZrO_2$, $HfO_2$, $Y_2O_3$ and other dielectric materials. The nanoparticle can be made from metal or semiconductor materials with a radius of (2-20 nm). The nano metal contact can have a radius between (2-20 nm). There are a few designs and operation modes of the basic unit memory cell for reading/writing and erasing processes, as further explained below.

In the first design, the nano M-S contact (NMSC), and the isolated nanoparticle are arranged on the top of the surface of the semiconductor substrate (like n-dope Si substrate), and the other electric contact is made with the back of the semiconductor substrate. The metal particle can be charged by a nano metal electrode on the top of the nanoparticle, referred to as charge control electrode (CCE), as shown in the schematic in FIG. 3. In the FIG. 3, numeral 301 denotes semiconductor. Numeral 302 denotes CCE. Numeral 303 denotes metal nano-contact. The nanoparticle can be charged with a negative charge by applying a positive voltage on the top electrode and grounding the substrate. Electron will tunnel via quantum tunneling through the oxide layer into the nanoparticle from the conduction band of semiconductor substrate.

Figure 4:
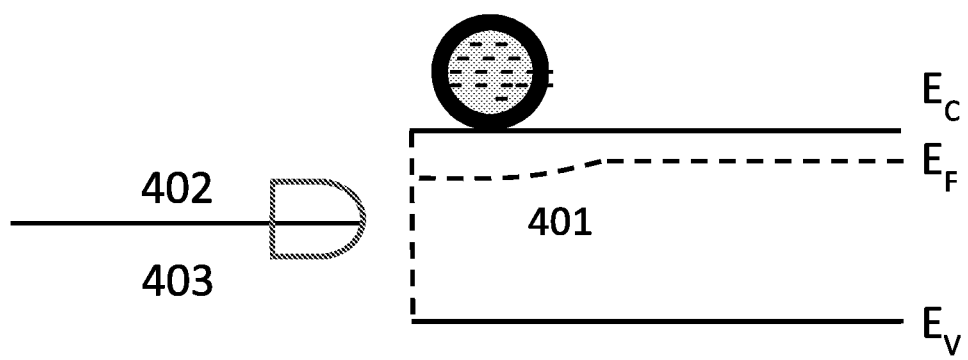
FIG. 4(a) denotes the energy band diagram before the nano-contact.
FIG. 4(b) shows the energy band diagram after the NMSC. [Note—the nano Schottky contact appears on the side to show the energy band diagram]
Figure 4:
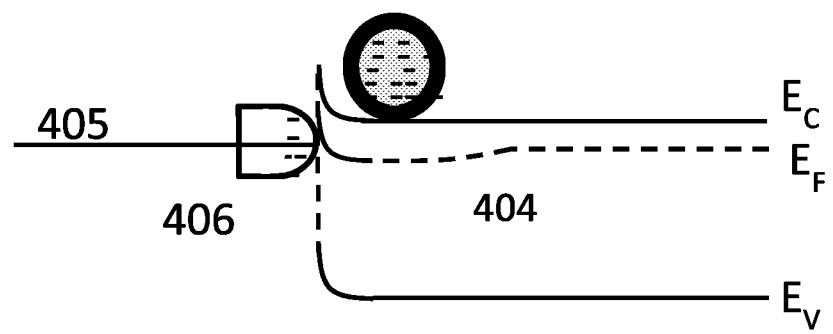
Figure 5:
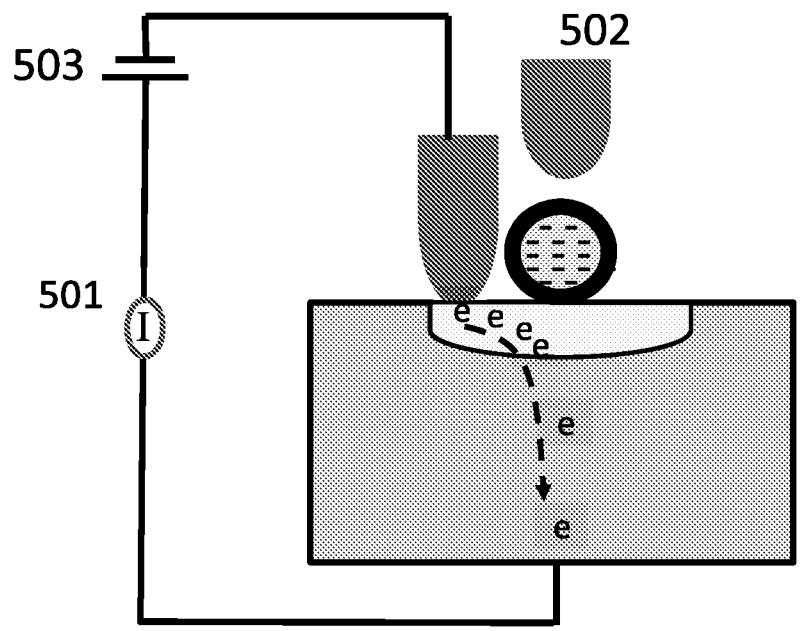
FIG. 5(a) shows a charged nanoparticle gives reading "1" at the threshold voltage.
FIG. 5(b) denotes that the reading is "0" for an uncharged nanoparticle.
Figure 5:
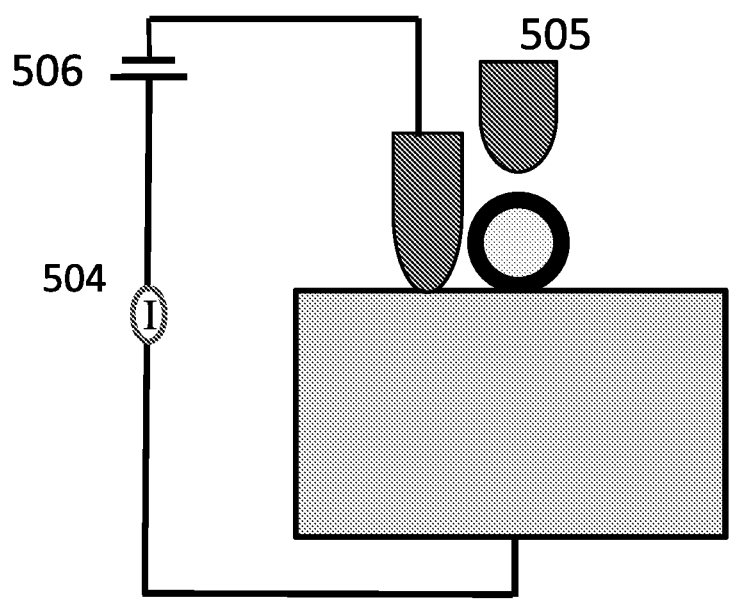
Figure 6:
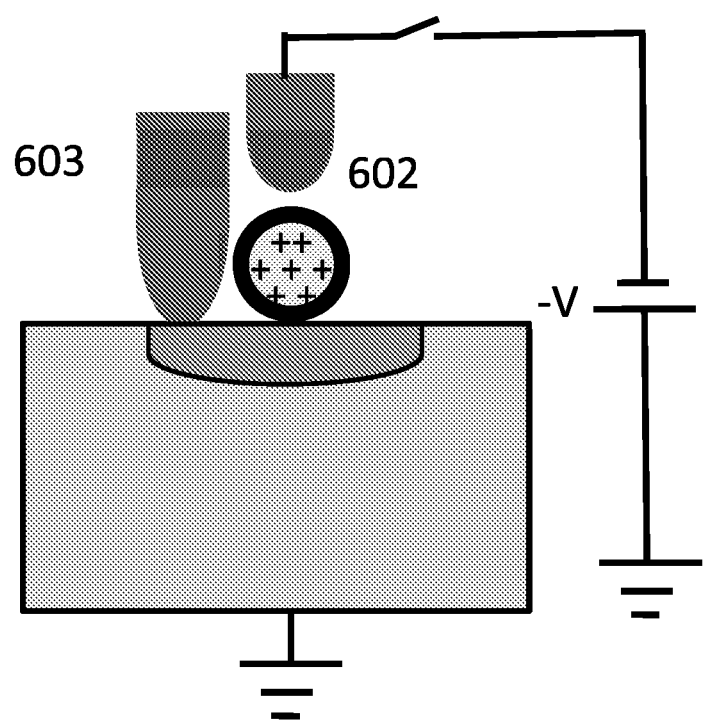
FIG. 6 illustrates the nano unit memory cell in the positive NP mode, showing the NMSC, the nanoparticle and CCE.

When the nano particle is charged this will create a high electric field around the nanoparticle which attract more positive charge near the surface of the substrate. This results in lowering the energy band in the vicinity of the nano metal contact source. This in turn results in a Fermi level at the surface lower than that of the bulk. The energy band diagram near the surface and in the vicinity of the nano source contact is schematically illustrated in FIG. 4. In FIG. 4(a), numeral 401 denotes n-dope semiconductor. Numeral 402 denotes metal $E_F$. Numeral 403 denotes nano-metal contact. In FIG. 4(b), numeral 404 denotes n-dope semiconductor. Numeral 405 denotes metal $E_F$. Numeral 406 denotes nano-metal contact. The lower Fermi level at the nano Schottky interface results in a narrow barrier, and thus an enhanced tunneling current when a small negative threshold bias ($V_{th}$<1 V) is applied on the NMSC. Whereas if there is no charge in the nanoparticle the Fermi level is high in the semiconductor side and the reverse tunneling current will require a higher voltage. This means that when the nanoparticle is charged the reading at $V_{th}$ is "1", and the reading is "0" when there is no charge in the nanoparticle, as illustrated in FIG. 5. In FIG. 5(a), numeral 501 denotes reading "1". Numeral 502 denotes CCE. Numeral 503 denotes $V_{th-}$. In FIG. 5(b), numeral 504 denotes reading "0". Numeral 505 denotes CCE. Numeral 506 denotes $V_{th-}$. This process of reading "1" and "0" is opposite to the charge case of the floating gate in the conventional flash memory CMOS devices. This mode of operation we can refer to as the negative nanoparticle charge mode (-NP). For erasing the data, discharging the nanoparticle, the bias used in the previous charging process is reversed to get the charge out of the nanoparticle.

Figure 7:
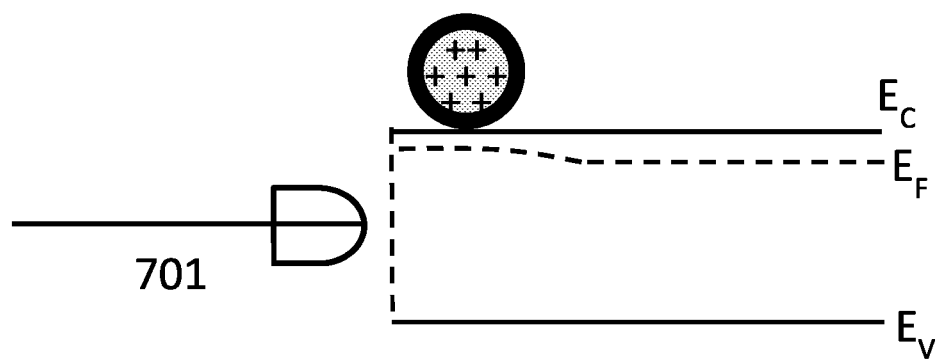
FIG. 7(a) shows the energy band diagram before the nano contact.
FIG. 7(b) shows the energy band diagram after the NMSC. [Note—the nano Schottky contact appears on the side to show the energy band diagram]
Figure 7:
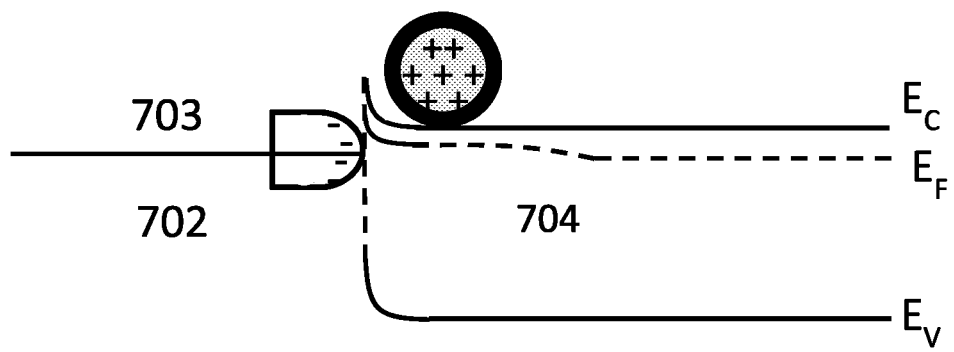
Figure 8:
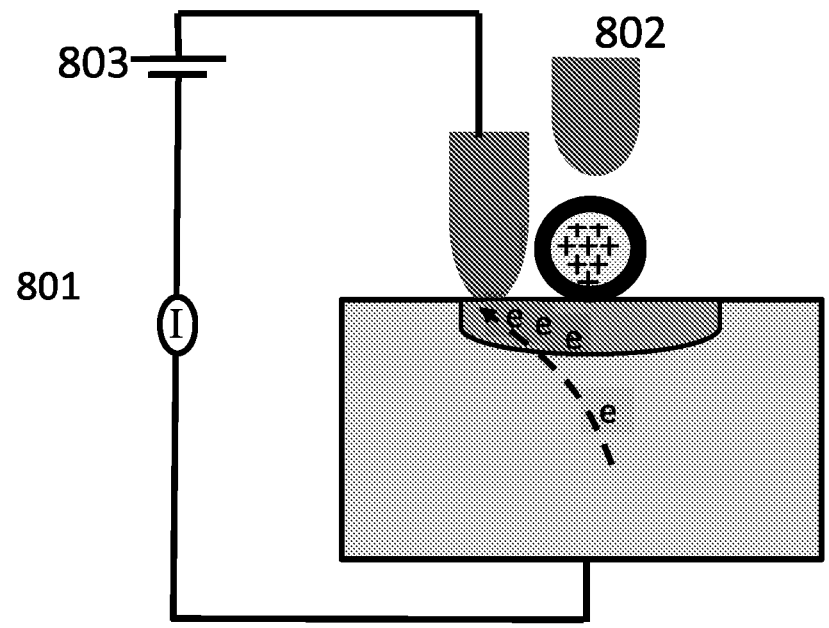
FIG. 8(a) shows a charged nanoparticle gives reading "1" at the threshold voltage.
FIG. 8(b) denotes that the reading is "0" for uncharged nanoparticle.
Figure 8:
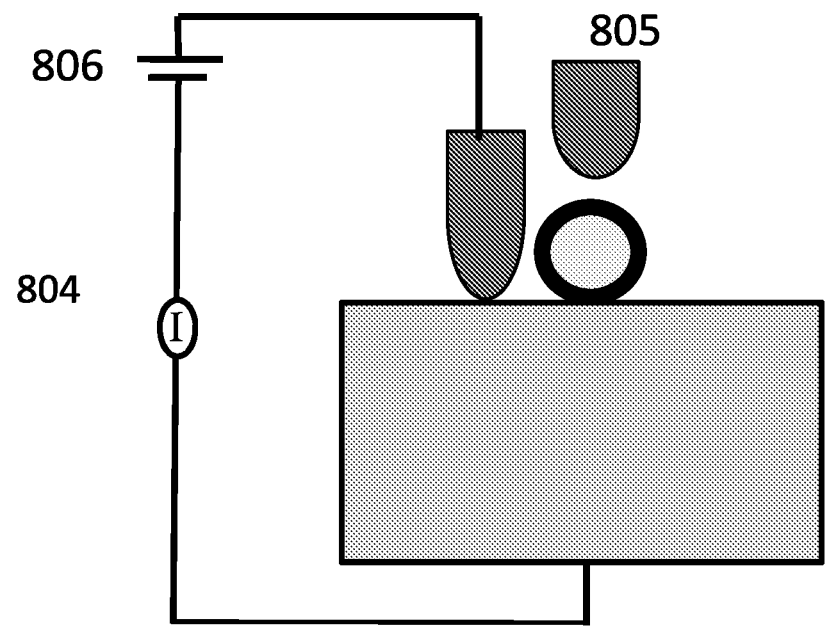

The other mode of operation is the positive nanoparticle charge mode (+NP). The particle here is charged positively by following the previous steps with opposite polarities, as in FIG. 6. In the FIG. 6, numeral 601 denotes semiconductor. Numeral 602 denotes CCE. Numeral 603 denotes metal nano-contact. The high positive electric field now results in accumulating negative charges near the surface which raises the energy band level higher than that of the bulk, turning this thin layer below the surface to a heavily n-dope region, as shown in the schematic in FIG. 7. In FIG. 7(a), numeral 701 denotes nano-metal contact. In FIG. 7(b), numeral 702 denotes nano-metal contact. Numeral 703 denotes metal $E_F$. Numeral 704 denotes n-dope semiconductor. When the nano metal-semiconductor contact (NMSC) is positively charged the electrons will flow from the bulk into the nano-metal contact (drain) via the thermionic and tunneling processes, as in the forward bias of conventional M-S contacts. In this case the nano M-S contact doesn't have to be very small. Again the charged nanoparticles means reading "1" while the uncharged nanoparticle means reading "0" at the same threshold voltage $V_{th}$, as shown in FIG. 8. The data (charge) can be erased by applying the opposite polarity of the charging process. In FIG. 8(a), numeral 801 denotes reading "1". Numeral 802 denotes CCE. Numeral 803 denotes $V_{th+}$. In FIG. 8(b), numeral 804 denotes reading "0". Numeral 805 denotes CCE. Numeral 806 denotes $V_{th+}$.

Figure 9:
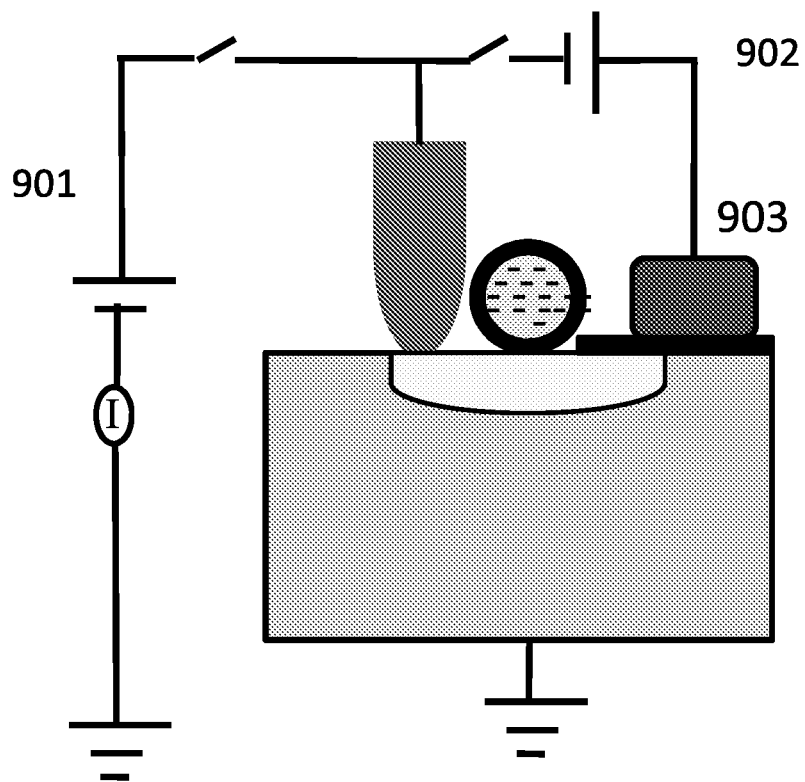
FIG. 9 illustrates the second design where the CCE is placed next to the nanoparticle and isolated from the substrate.

The second design is illustrated in FIG. 9. The charging electrode is placed next to the nanoparticle on the opposite side of the nano metal-semiconductor contact (NMSC) but isolated from the substrate. The distance between the charge control electrode (CCE) and the nanoparticle is a few times larger than that between the nanoparticle and the nano metal-semiconductor contact NMSC. So that the charging process can take place between the nanoparticle and the nano-Schottky electrode through the tunneling process. The particle can be charged negatively by applying a negative voltage difference between the nano metal-semiconductor contact (NMSC) and the charge control electrode (CCE). The nanoparticle can also be charged positively by reversing the voltage polarity between the nano metal-semiconductor contact (NMSC) and the charge control electrode (CCE). The reading process can be performed the same way as in the first design. In the FIG. 9, numeral 901 denotes reading line (bit line). Numeral 902 denotes charging/discharging line. Numeral 903 denotes CCE.

Figure 10:
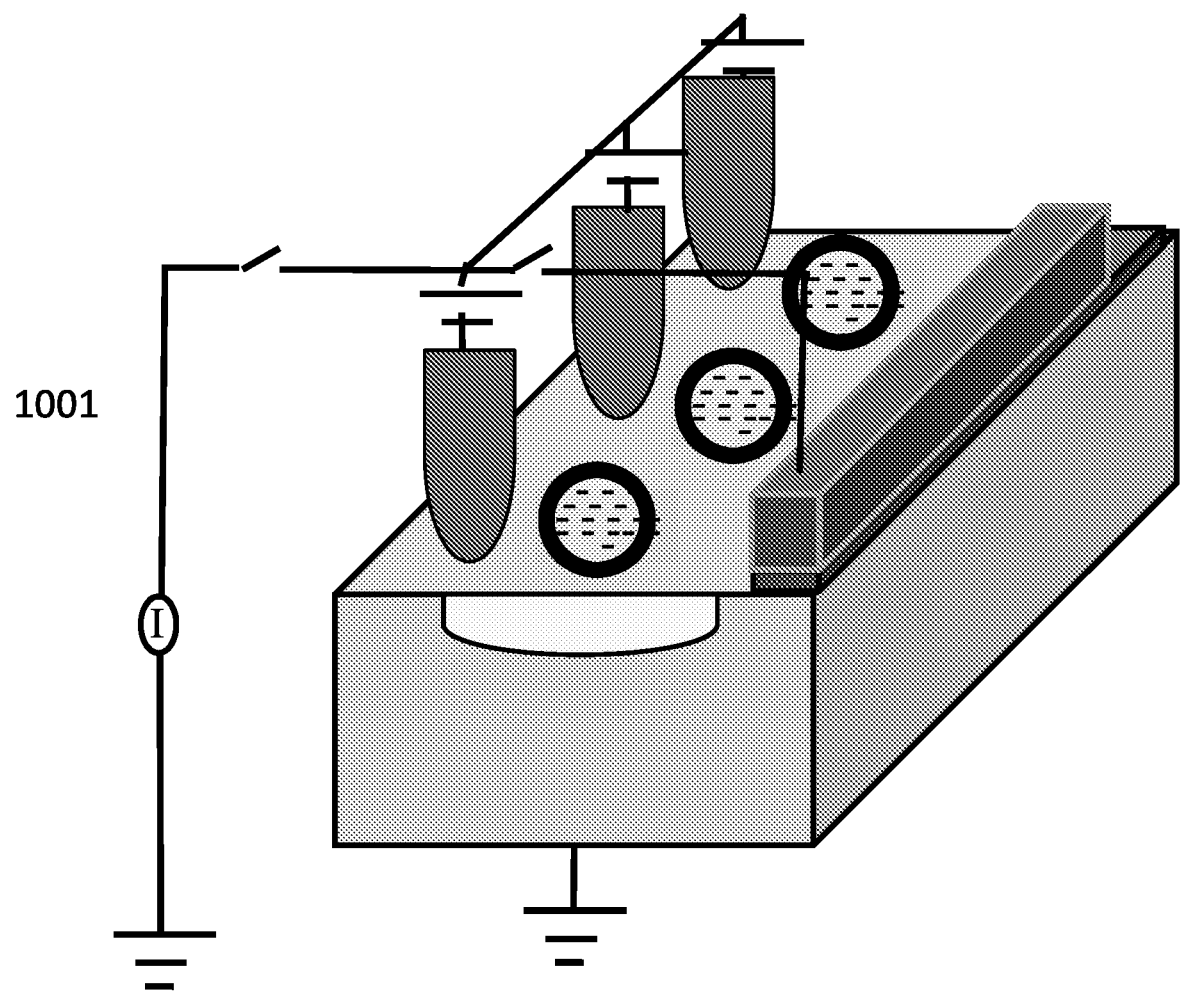
FIG. 10 illustrates a parallel cells arrangement.

However, this design is suitable for multiple cells to be arranged in parallel (like NOR array) with a common CCE terminal and common CCE, as shown in the schematic in FIG. 10, as only one long CCE is needed. In the FIG. 10, numeral 1001 denotes reading line (bit line). Again here the current (on) or "1" or (off) or "0" has to be measured from common (NMSC) line (bit line). In an embodiment of the present invention, the same voltage source on each cell can be used for reading/writing and erasing processes by considering the appropriate voltage polarity and threshold values. This arrangement actually leads to high density of memory cells more than that of conventional NOR flash memory devices where the number of cells is limited due to the nature cell structure.

Figure 11:
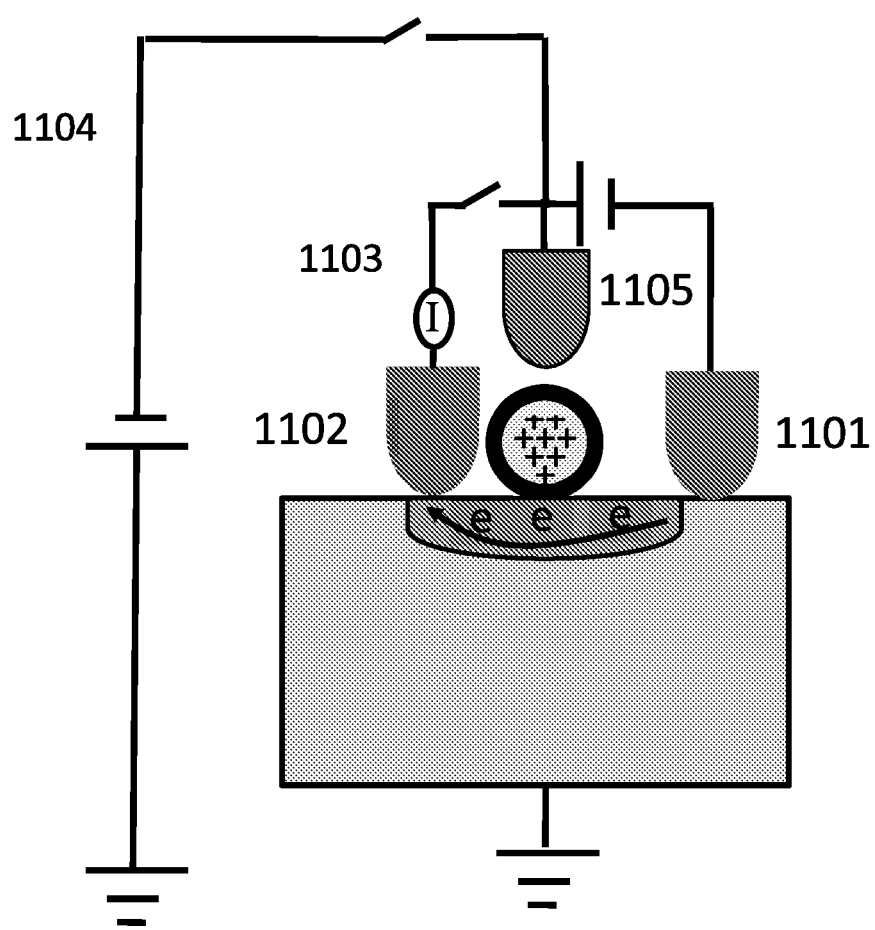
FIG. 11 shows the third design where the source/drain connections are made on the top of the substrate surface.

In the third design the nano metal-semiconductor contact (NMSC), the isolated nanoparticle, and the drain (also nano M-S contact) are all placed on the surface of the semiconductor, and the charge control electrode (CCE) is placed on the top of the nanoparticle, as schematically shown in FIG. 11. In the FIG. 11, numeral 1101 denotes source. Numeral 1102 denotes drain. Numeral 1103 denotes reading line (bit line). Numeral 1104 denotes charging/discharging line. Numeral 1105 denotes CCE. Unlike the configuration of the conventional floating gate flash memory, here the source and drain are made of nano-Schottky contacts rather than heavily n-dope semiconductor terminals (n+), and the floating gate here is replaced by a single nanoparticle. Furthermore the current flow mechanism is due to the enhancement of carriers (electrons) near the surface from an n-dope substrate, not p-dope as in the conventional flash memory devices.

Figure 12:
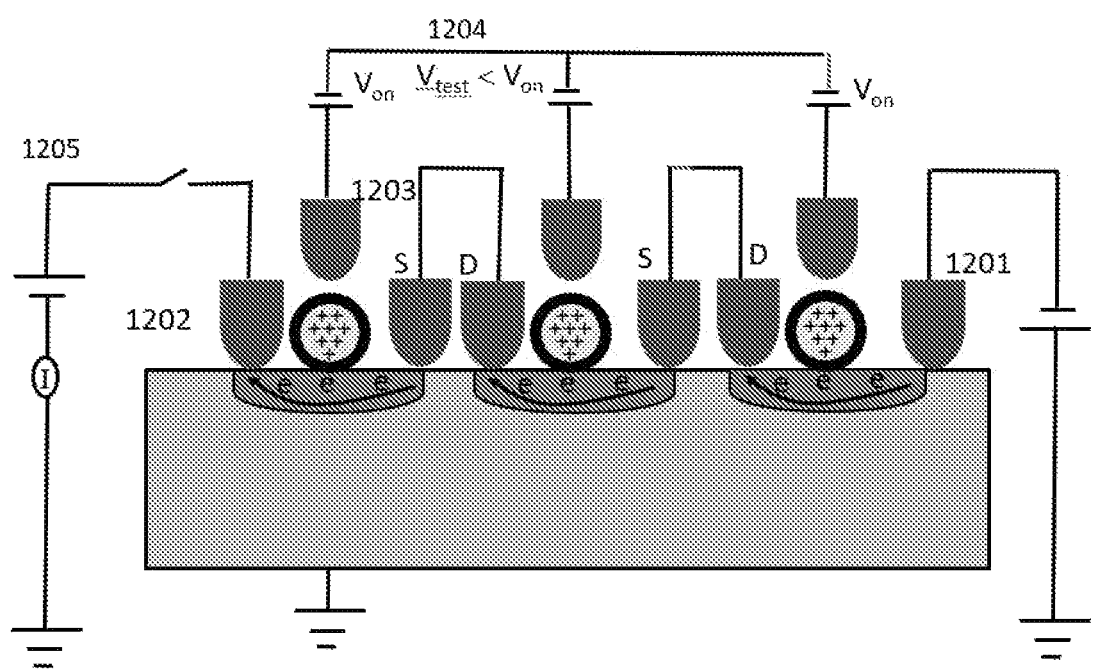
FIG. 12 shows the series arrangement with positive +NP ("1" reading).

In this design charging and discharging (writing/erasing) processes of the nanoparticle can be achieved by applying a bias between the charge control electrode (CCE) and the back contact of the substrate. For multiple cells arrangement a single charge control electrode (CCE) for each nanoparticle has to be used. This nano-memory cell design is suitable for series arrangement, analogous to NAND flash memory configuration, where the source and drain are all made from metal nano contacts. The first series (NAND) arrangement is depicted in FIG. 12. In the FIG. 12, numeral 1201 denotes source. Numeral 1202 denotes drain. Numeral 1203 denotes CCE. Numeral 1204 denotes charging/discharging line. Numeral 1205 denotes reading line (bit line). Although this configuration works in both modes (−NP and +NP modes), it is preferable here to have a positive nanoparticle charge (+NP) mode where electrons flow from the semiconductor into the nano-metal contact. To read from a selected cell a positive voltage above a threshold value $V_{on}$ will be applied to all charge control electrodes (CCE) to turn them on, while for the selected one a voltage less than $V_{on}$ is applied $V_{test}<V_{on}$. If the nanoparticle is charged the reading then will be "1", if the nanoparticle is uncharged then the reading will be "0".

Figure 13:
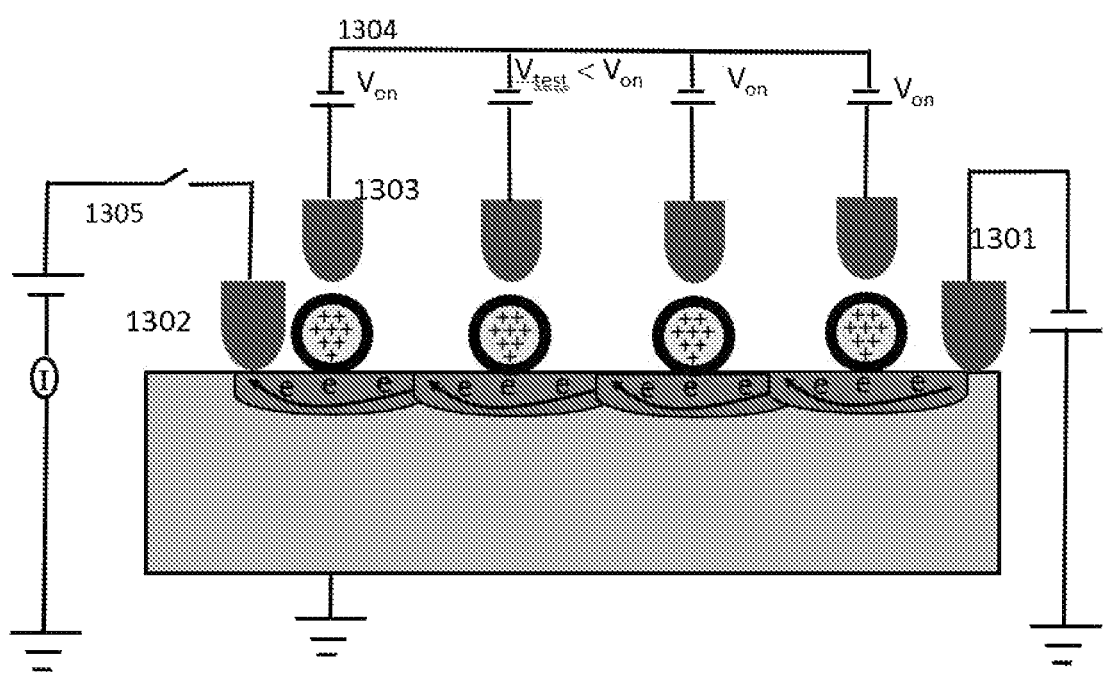
FIG. 13 shows the series arrangement without internal drain/source terminals ("1" reading).

For even higher density of cells the internal Source (S) and Drain (D) electrode can be removed and the nanoparticles can be brought in a very close vicinity, where the underneath electron channels overlap and form one path of electrons. In the positive nanoparticle mode, if all nanoparticles are positively charged then the reading is on "1" when all CCE voltages are on and the selected cell one has $V_{test}<V_{on}$. If the selected cell is uncharged this will interrupt the undersurface electrons path and the reading will be "0" when $V_{test}<V_{on}$. This series (NAND) configurations is illustrated in FIG. 13. In the FIG. 13, numeral 1301 denotes source. Numeral 1302 denotes drain. Numeral 1303 denotes CCE. Numeral 1304 denotes charging/discharging line. Numeral 1305 denotes reading line (bit line).

These new nano memory devices can be readily adapted in all data storage devices like mobile phones, digital cameras, computers, laptops, smart TVs, medical systems, network servers and database systems, etc. These applications span a wide range of industry sectors and involve almost all high-tech and electronic chip companies, like INTEL, MIT, Samsung, LG, TSMC (Taiwan), and many others.

For the fabrication of such unit nano memory cells, nanoparticles are available commercially with the desired materials and sizes, and they can also be prepared readily in a laboratory. Then these nanoparticles can be moved to the atomic force microscope (AFM) system and be manipulated in a desired configuration with the AFM probe. In fact nano-probes with extremely sharp ends (1-5 nm) can be readily fabricated. For industrial uses and large scale manufacturing, the available nano fabrication tools, like electron beam lithography focused ion beam lithography or enhanced EUV photolithography, and nano materials deposition systems can be used to deposit nanoparticles and fabricate nano pillars to replace the nano-probes for forming NMSC and CCE, and for the drain/source nano-contact. This can be done utilizing a dielectric material (resist) like PMMA covering the whole surface of the substrate for creating the desired patterns.

Many changes, modifications, variations and other uses and applications of the subject invention will become apparent to those skilled in the art after considering this specification and the accompanying drawings, which disclose the preferred embodiments thereof. All such changes, modifications, variations and other uses and applications, which do not depart from the spirit and scope of the invention, are deemed to be covered by the invention, which is to be limited only by the claims which follow.

The invention claimed is:

1. A unit nano memory cell comprising a charge storage site, the charge storage site consisting of a single isolated nanoparticle positioned on a surface of a semiconductor substrate.

2. The unit nano memory cell of claim 1, further comprising a single nano metal-semiconductor contact working as a source or a drain of electrons at less than 1.0V.

3. The unit nano memory cell according to claim 2, wherein the single nanoparticle is isolated from the semiconductor substrate and the nano metal-semiconductor contact by 1 to 5 nanometers of a dielectric material.

4. The unit nano memory cell according to claim 3, wherein the dielectric material comprises at least a portion having a high dielectric constant (k), and wherein the dielectric material is Si3N4, $ZrO_2$, $HfO_2$ or $Y_2O_3$.

5. The unit nano memory cell according to claim 2, wherein the semiconductor substrate surface has a top side and a bottom side, and wherein:

the single nano metal-semiconductor contact and the single isolated nanoparticle are positioned on the top side of the semiconductor substrate surface; and an electric contact is made with the top side and bottom side of the semiconductor substrate.

6. The unit nano memory cell according to claim 5, wherein the electric contact is a nano-Schottky contact.

7. The unit nano memory cell of claim 2, wherein
the single isolated nanoparticle and the single nano metal-semiconductor contact are placed on the semiconductor surface; and
a charge control electrode is placed on the top of the single isolated nanoparticle.

8. The unit nano memory cell of claim 7, wherein source and drain terminals of the single nano metal-semiconductor contact comprise of nano-Schottky contacts.

9. The unit nano memory cell according to claim 7, wherein charging and discharging processes of the single isolated nanoparticle are analogous to writing and erasing processes respectively.

10. The unit nano memory cell according to claim 7, wherein charging and discharging processes of the single isolated nanoparticle comprise steps of applying a bias between the charge control electrode and a back contact of the semiconductor substrate.

11. The unit nano memory cell according to claim 1, wherein the single isolated nanoparticle is made of metal or another semiconductor material and has a radius in a range of 2-20 nanometers.

12. The unit nano memory cell of claim 1, wherein charge being stored in a nanoparticle allows device downscaling, and wherein a same voltage source is utilized for each unit nano memory cell for reading, writing and erasing processes.

13. A method of charging a unit nano memory cell comprising a semiconductor substrate and a charge storage site, the charge storage site consisting of a single isolated nanoparticle positioned on a surface of the semiconductor substrate, the method comprising the steps of:
charging the single isolated nanoparticle with a negative charge; and
grounding the semiconductor substrate.

14. The method of claim 13, wherein the charging the single isolated nanoparticle is conducted using a nano metal electrode placed on top of the single isolated nanoparticle, wherein the nano metal electrode is a charge control electrode.

15. A method of negatively charging the unit nano memory cell according to claim 14, comprises the step of applying a negative voltage between a single nano metal-semiconductor contact and the charge control electrode.

16. A method of positively charging the unit nano memory cell according to claim 14, comprises the step of reversing a polarity of the applied negative voltage between a single nano metal-semiconductor contact and the charge control electrode.

17. The method according to claim 13, wherein the charging the single isolated nanoparticle allows electric current to pass through a nano-Schottky junction.

18. The method according to claim 13, wherein a method of discharging the unit nano memory cell comprises:
reversing a bias used for charging the unit nano memory cell, which results in erasing of data stored in the unit nano memory cell.

19. A multiple cell arrangement comprising a plurality of unit nano memory cells, wherein
each unit nano memory cell comprises a charge storage site that consists of a single isolated nanoparticle; and
a single charge control electrode is utilized for each nanoparticle.

20. The multiple cell arrangement of claim 19, wherein the plurality of nano memory cells is implemented through a series or parallel configuration of the plurality of nano memory cells.

* * * * *